(12) United States Patent
Okino

(10) Patent No.: US 11,949,269 B2
(45) Date of Patent: Apr. 2, 2024

(54) MANAGEMENT SERVER, MANAGEMENT SYSTEM, AND MANAGEMENT METHOD

(71) Applicant: KYOCERA Corporation, Kyoto (JP)

(72) Inventor: Kenta Okino, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 644 days.

(21) Appl. No.: 17/256,174

(22) PCT Filed: Jun. 13, 2019

(86) PCT No.: PCT/JP2019/023419
§ 371 (c)(1),
(2) Date: Dec. 25, 2020

(87) PCT Pub. No.: WO2020/004053
PCT Pub. Date: Jan. 2, 2020

(65) Prior Publication Data
US 2021/0265850 A1 Aug. 26, 2021

(30) Foreign Application Priority Data

Jun. 28, 2018 (JP) ................................. 2018-122949

(51) Int. Cl.
*H02J 7/00* (2006.01)
*G01R 31/382* (2019.01)
(Continued)

(52) U.S. Cl.
CPC .......... *H02J 7/0071* (2020.01); *G01R 31/382* (2019.01); *G01R 31/392* (2019.01);
(Continued)

(58) Field of Classification Search
None
See application file for complete search history.

(56) References Cited

U.S. PATENT DOCUMENTS 9,583,945 B2    2/2017  Watanabe
9,720,478 B2 *  8/2017  Hanafusa .......... H02J 13/00022
                        (Continued)

FOREIGN PATENT DOCUMENTS

JP              201615875 A     1/2016

*Primary Examiner* — Leigh M Garbowski
(74) *Attorney, Agent, or Firm* — HAUPTMAN HAM, LLP

(57) ABSTRACT

A management server including a server performing maintenance and management to a plurality of storage battery apparatuses included in an object of charge and discharge control by a control server. The management server includes processor. The processor is configured to execute a specification process, a selection process, a notification process. The specification process includes a process of specifying each of deterioration degree of the plurality of the storage battery apparatuses. The selection process includes a process of selecting an excluded storage battery apparatus excluding from the object of the charge and discharge control by the control server, out of the plurality of the storage battery apparatuses, based on the deterioration degree specified by the specification process. The notification process includes a process of notifying, to the control server, notification that the charge and discharge control to the excluded storage battery apparatus selected by the selection process is unable.

13 Claims, 8 Drawing Sheets

(51) Int. Cl.
*G01R 31/392* (2019.01)
*H01M 10/48* (2006.01)

(52) U.S. Cl.
CPC ........... *H01M 10/48* (2013.01); *H02J 7/0048* (2020.01); *H02J 7/005* (2020.01)

(56) References Cited

U.S. PATENT DOCUMENTS

| | | | | |
|---|---|---|---|---|
| 10,164,298 | B2* | 12/2018 | Sugeno | B60L 58/15 |
| 10,523,029 | B2* | 12/2019 | Arai | H02J 7/007194 |
| 10,535,999 | B2* | 1/2020 | Hidaka | H01M 10/441 |
| 11,362,516 | B2* | 6/2022 | Kitaji | H02J 13/00006 |
| 11,535,121 | B2* | 12/2022 | Hokoi | B60L 58/13 |
| 2014/0089692 | A1 | 3/2014 | Hanafusa | |
| 2015/0142200 | A1* | 5/2015 | Oh | H02J 13/00016 |
| | | | | 700/297 |
| 2016/0254680 | A1* | 9/2016 | Arai | H01M 10/44 |
| | | | | 320/107 |
| 2017/0117587 | A1 | 4/2017 | Sugeno et al. | |
| 2020/0398693 | A1* | 12/2020 | Haraguchi | H02J 13/00006 |

* cited by examiner

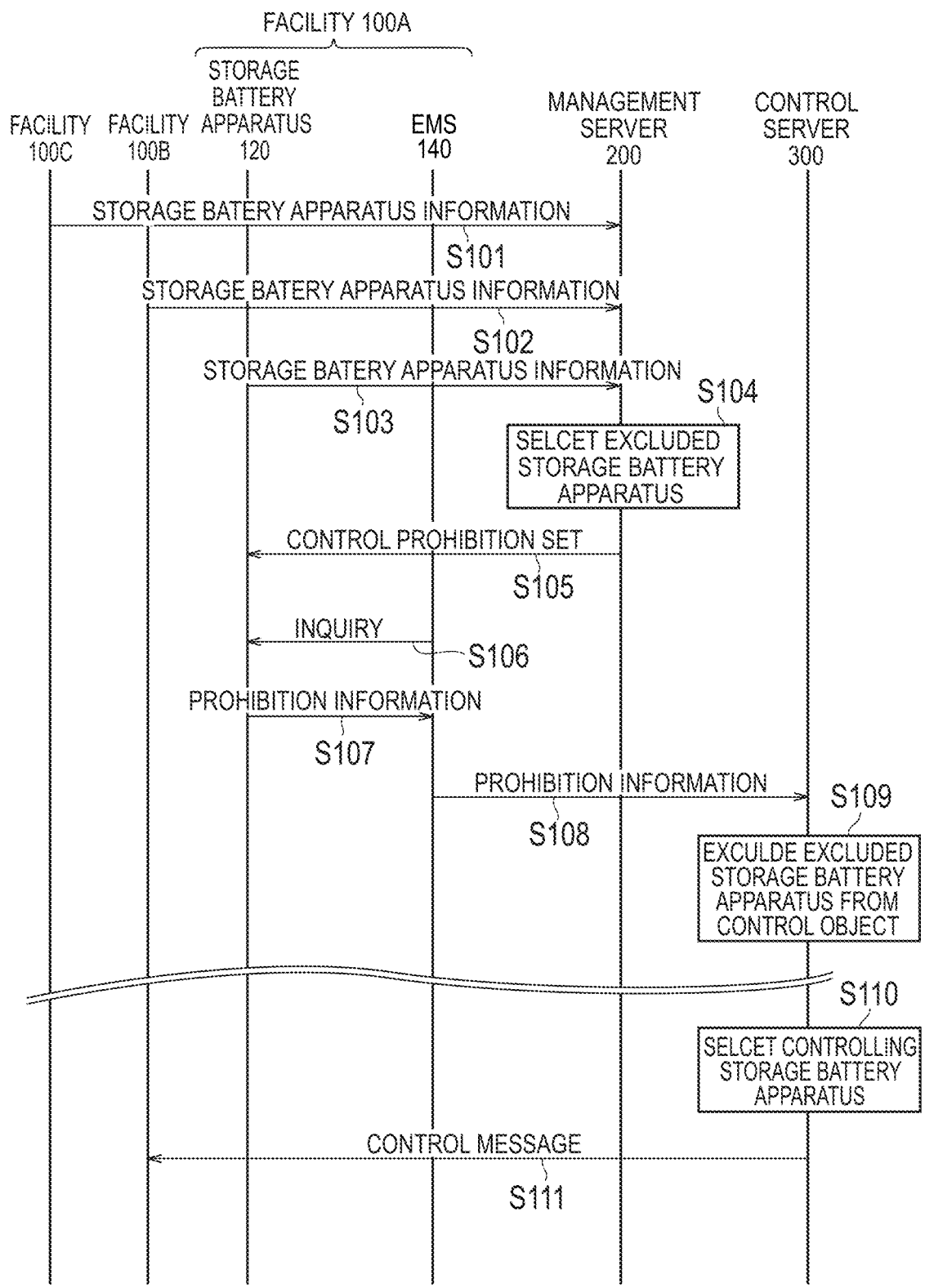

FIG. 6

| PROPERTY NAME | EPC | PROPERTY CONTENT | | DATA TYPE | DATA SIZE | UNIT | ACCESS RULE |
|---|---|---|---|---|---|---|---|
| | | RANGE (DECIMAL NUMBER) | | | | | |
| RE-CONNECTION PERMISSION SETTING | 0xCC | SET PERMISSION, PROHIBITION OF CONNECTION TO GRID | | UNSIGNED CHAR | 1 BYTE | — | SET/GET |
| | | PERMISSION=0x41, PROHIBITION=0x42 | | | | | |
| OPERATION PERMISSION SETTING | 0xCD | SET PERMISSION, PROHIBITION OF STORAGE BATTERY APPARATUS OPERATION | | UNSIGNED CHAR | 1 BYTE | — | SET/GET |
| | | PERMISSION=0x41, PROHIBITION=0x42 | | | | | |
| SELF-SUSTAINED OPERATION PERMISSION SETTING | 0xCE | SET PERMISSION, PROHIBITION OF SELF-SUSTAINED OPERATION OF STORAGE BATTERY | | UNSIGNED CHAR | 1 BYTE | — | SET/GET |
| | | PERMISSION=0x41, PROHIBITION=0x42 | | | | | |
| EXTERNAL CONTROL SETTING | 0x** | SET PERMISSION, PROHIBITION OF EXTERNAL CONTROL OF STORAGE BATTERY | | UNSIGNED CHAR | 1 BYTE | — | GET |
| | | PERMISSION=0x41, PROHIBITION=0x42 | | | | | |

NEW ADDITION

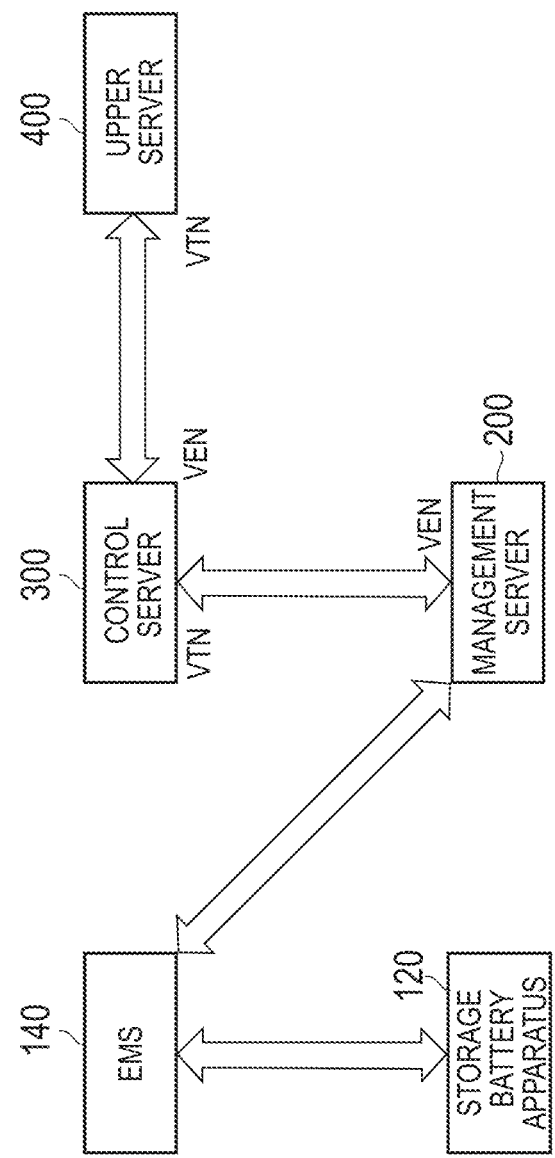

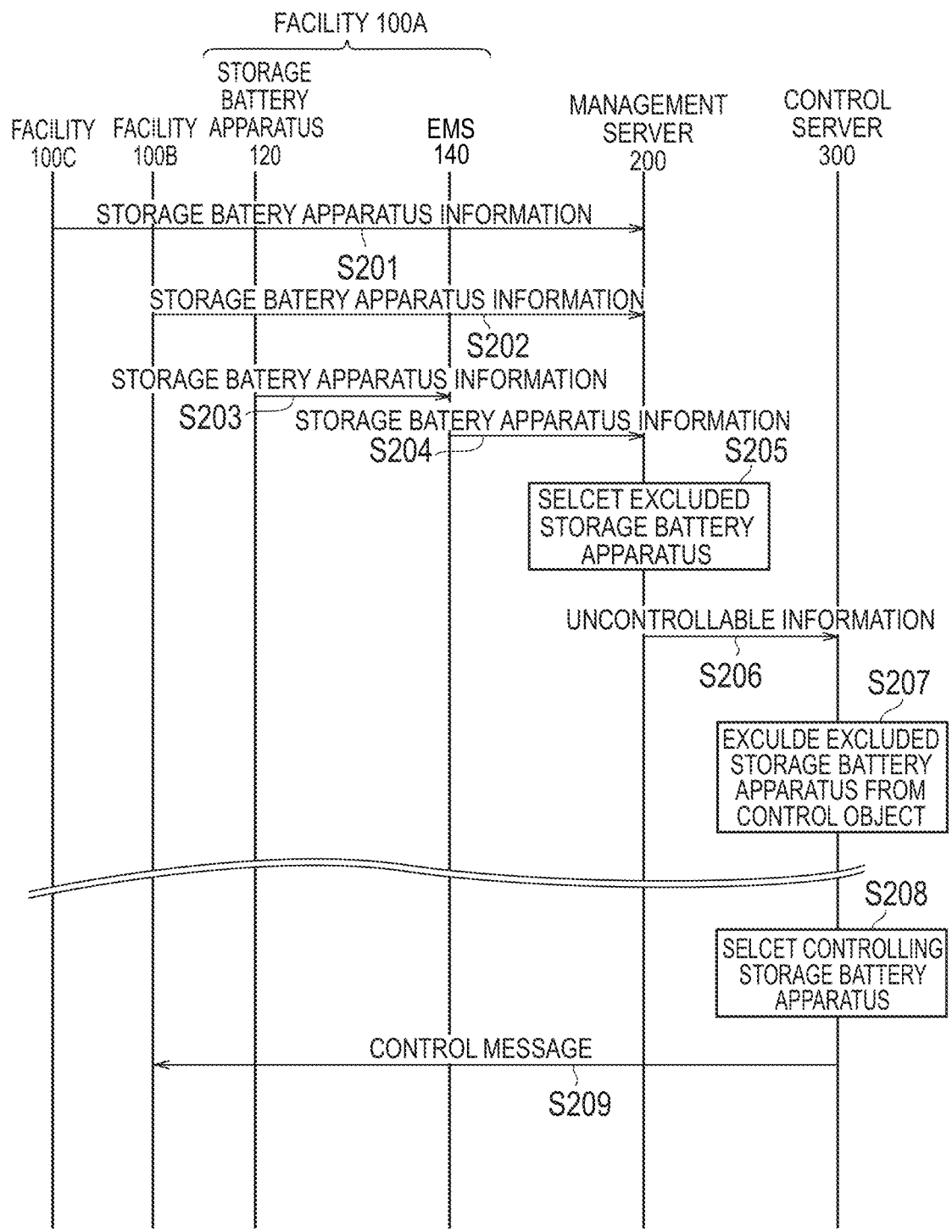

MANAGEMENT SERVER, MANAGEMENT SYSTEM, AND MANAGEMENT METHOD

RELATED APPLICATIONS

The present application is a National Phase of International Application No. PCT/JP2019/023419, filed Jun. 13, 2019, and claims priority based on Japanese Patent Application No. 2018-122949, filed Jun. 28, 2018.

TECHNICAL FIELD

The present invention relates to a management server, a management system, and a management method.

BACKGROUND ART

In recent years, a VPP (Virtual Power Plant) being a technique for controlling integratedly a distributed-type energy resource which a facility such as a household, factory, or the like has and causing to function as one virtual power station is paid attention. A control server for a company (referred as "aggregator") performing the control performs integrated control according to a request from a power company such as a power transmission and distribution business operator or the like.

Further, in Patent Literature 1, a system for controlling integratedly a plurality of distributedly located storage battery apparatuses is described. In the system described in Patent Literature 1, an apparatus controlling charge and discharge of the plurality of storage battery apparatuses selects the storage battery apparatus to be discharged or charged out of the plurality of storage battery apparatuses depending on deterioration degree each of the plurality of storage battery apparatuses.

CITATION LIST

Patent Literature

Patent Literature 1: Japanese Application Publication No. 2016-15875

SUMMARY OF THE INVENTION

A management server according to a first disclosure is a server performing maintenance and management to a plurality of storage battery apparatuses included in an object of charge and discharge control by a control server. The management server includes at least one processor. The at least one processor is configured to execute a specification process, a selection process, a notification process. The specification process includes a process of specifying each of deterioration degree of the plurality of the storage battery apparatuses. The selection process includes a process of selecting an excluded storage battery apparatus excluding from the object of the charge and discharge control by the control server, out of the plurality of the storage battery apparatuses, based on the deterioration degree specified by the specification process. The notification process includes a process of notifying, to the control server, notification that the charge and discharge control to the selected excluded storage battery apparatus is unable.

A management system according to a second disclosure includes a system performing maintenance and management to a plurality of storage battery apparatuses included in an object of charge and discharge control by a control server. The management system includes at least one processor. The at least one processor is configured to execute a specification process, a selection process, and a notification process. The specification process includes a process of specifying each of deterioration degree of the plurality of the storage battery apparatuses. The selection process includes a process of selecting an excluded storage battery apparatus excluding from the object of the charge and discharge control by the control server, out of the plurality of the storage battery apparatuses, based on the deterioration degree specified by the specification process. The notification process includes a process of notifying, to the control server, notification that the charge and discharge control to the excluded storage battery apparatus selected by the selection process is unable.

A management method according to a third disclosure includes performing maintenance and management to a plurality of storage battery apparatuses included in an object of charge and discharge control by a control server. The performing maintenance and management includes: specifying each of deterioration degree of the plurality of the storage battery apparatuses, selecting an excluded storage battery apparatus excluding from the object of the charge and discharge control by the control server, out of the plurality of the storage battery apparatuses, based on the specified deterioration degree, and notifying, to the control server, notification that the charge and discharge control to the selected excluded storage battery apparatus is unable.

A storage battery apparatus according to a fourth disclosure is provided in a facility. The storage battery apparatus includes a memory and at least one processor. The memory is configured to execute a process of storing outside control set information indicating whether or not control from a control server is permitted. The at least one processor is configured to execute a reception process and transmission process. The reception process includes a process of receiving a request message requesting transmission of the outside control set information from a management apparatus managing power of the facility. The transmission process includes a process of transmitting, to the management apparatus, a response message including the outside control set information in response to reception of the request message. Here the outside control set information may be set information that setting is unable from the management apparatus to the storage battery apparatus.

A management apparatus according to a fifth disclosure manages power of a facility. The management apparatus includes at least one processor. The at least one processor is configured to execute a first transmission process, reception process, and a second transmission process. The first transmission process includes a process of transmitting, to a storage battery apparatus provided in the facility, a request message requesting transmission of outside control set information indicating whether or not permission of control from a control server. The reception process includes a process of receiving a response message including the outside control set information from the storage battery apparatus. The second transmission process includes a process of transmitting information based on received outside control set information to the control server.

BRIEF DESCRIPTION OF DRAWINGS

FIG. 5 is a diagram illustrating an example of an operation sequence in a management system according to an embodiment.

FIG. 6 is a diagram illustrating an example of outside control set information according to an embodiment.

FIG. 7 is a diagram illustrating a modified example of a communication path configuration in a management system according to an embodiment.

FIG. 8 is a diagram illustrating an example of an operation sequence in a management system according to a modified example of an embodiment.

DESCRIPTION OF EMBODIMENTS

Figure 1:
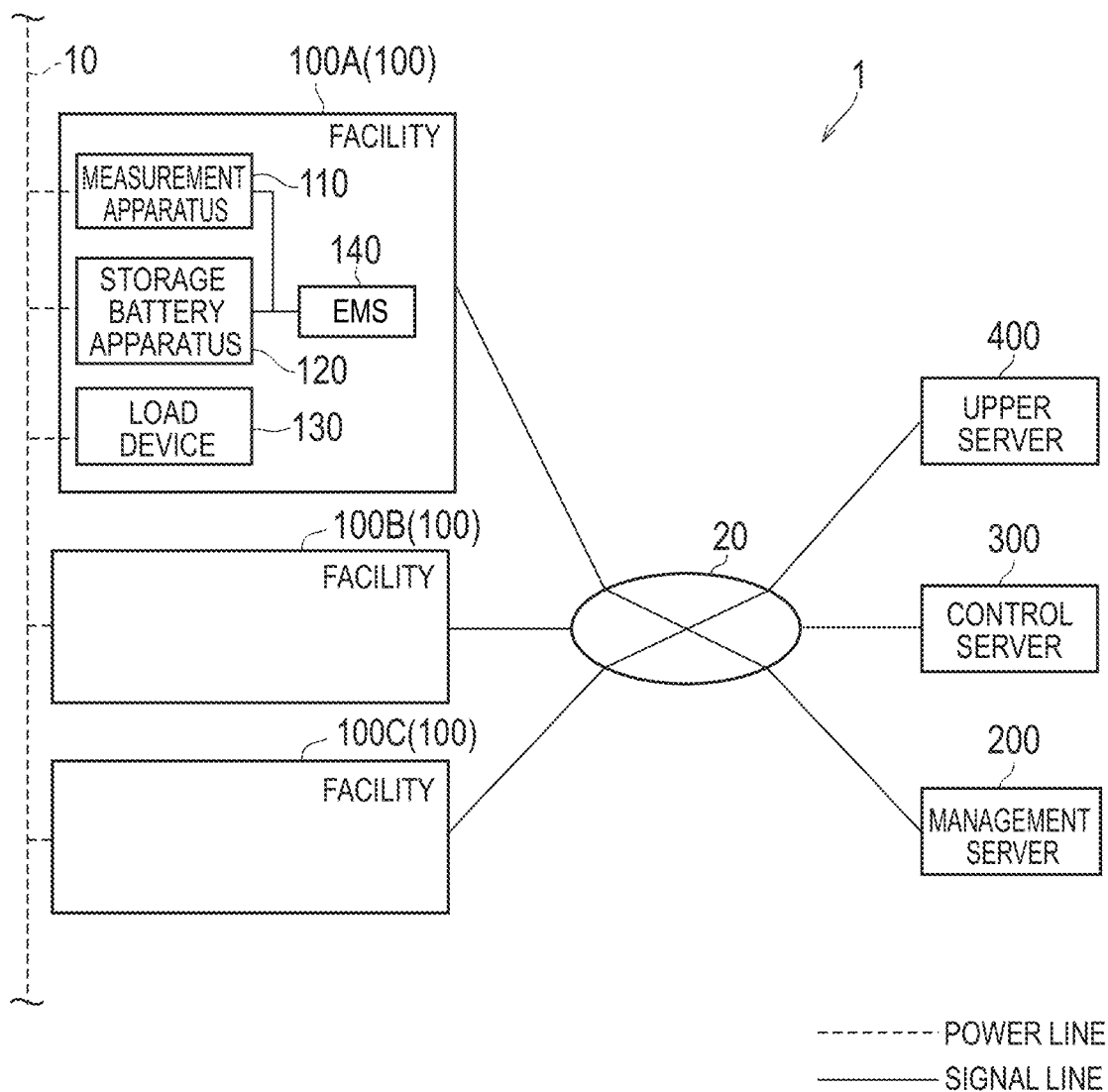
FIG. 1 is a diagram illustrating a configuration of a management system according to an embodiment.

For a user of a storage battery apparatus and/or operator performing maintenance and management of the storage battery apparatus (can be a maker of the storage battery apparatus), it is important that a product life which the maker of the storage battery apparatus guarantees is fulfilled. Further, it is undesirable that deterioration proceeds quickly in only one process storage battery apparatus by charge and discharge control of a control server.

However, though an aggregator has responsibility performing integrated control according to a request from a power company, there is a case where it has no responsibility performing maintenance and management of the storage battery apparatus. Therefore, there is a case where the control server performs the charge and discharge control without consideration of deterioration of each of the storage battery apparatuses sufficiently.

Namely, when the control server integrally controls the plurality of the storage battery apparatuses, there is a possibility that deterioration proceeds quickly in only one process storage battery apparatus. In an extreme case, there are concerns that the storage battery apparatus not fulfilling a product life guaranteed by the maker occurs.

Then, present disclosure provides a management server, management system, and management method possible to avoid that deterioration proceeds quickly in only one process storage battery apparatus, even when a control server performs integrated control of a plurality of storage battery apparatuses without consideration the deterioration.

A management server according to an embodiment is a server performing maintenance and management to a plurality of storage battery apparatuses included in an object of charge and discharge control by a control server. The management server includes at least one processor. The at least one processor is configured to execute a specification process, a selection process, a notification process. The specification process includes a process of specifying each of deterioration degree of the plurality of the storage battery apparatuses. The selection process includes a process of selecting an excluded storage battery apparatus excluding from the object of the charge and discharge control by the control server, out of the plurality of the storage battery apparatuses, based on the deterioration degree specified by the specification process. The notification process includes a process of notifying, to the control server, notification that the charge and discharge control to the excluded storage battery apparatus selected by the selection process is unable.

Thereby, even when a control server performs integrated control of a plurality of storage battery apparatuses without consideration deterioration, it is possible to provide a management server, management system, and management method possible to avoid that deterioration proceeds quickly in only a storage battery apparatus of a partial process.

It will be described with reference to the drawings about a management system according to an embodiment. Further, in the following description of the drawings, same or similar parts are marked with same or similar signs.

(Management System)

FIG. 1 is a diagram illustrating a configuration of a management system 1 according to the present embodiment.

As illustrated in FIG. 1, the management system 1 includes a plurality of facilities 100, management server 200, control server 300, and upper server 400. In FIG. 1, as the plurality of facilities 100, facilities 100A to 300C are exemplified. Since each of facilities 100 is same configuration, only configuration of the facility 100A is illustrated out of the facilities 100A to 300C in FIG. 1. Each of the facilities 100 is connected to a power grid 10. In the following, the flow of power from the power grid 10 to the facility 100 is called to as a flow. Further, the flow of power from the facility 100 to the power grid 10 is called to as a backward flow. Power from the power grid 10 to the facility 100 may be called as demand power.

The facility, management server 200, control server 300, and upper server 400 are connected to a communication network 20. For example, the communication network 20 may include an internet. Further, the communication network 20 may include a dedicated line such as a VPN (Virtual Private Network) or the like.

The facility 100 includes a measurement apparatus 110, storage battery apparatus 120, load device 130, and EMS (Energy Management System) 140. The facility 100 may further include distributed power supply such as a photovoltaic generation apparatus or the like.

The measurement apparatus 110 is an apparatus which measures a flow amount and backward flow amount. The measurement apparatus 110 transmits a measurement data to the EMS 140.

The storage battery apparatus 120 is an apparatus which performs charge and discharge. The storage battery apparatus 120 includes a lithium ion storage battery apparatus, lead storage battery apparatus, nickel hydrogen storage battery apparatus, or the like. The storage battery apparatus 120 is controlled by the EMS 140. Further, the storage battery apparatus 120 performs communication with the management server 200.

The load device 130 is a device consuming power. For example, the load device 130 includes an air conditioner, illumination device, AV (Audio Visual) device, or the like.

The EMS 140 is an apparatus managing power of the facility 100. The EMS 140 is an example of a control apparatus controlling the storage battery apparatus 120. The EMS 140 may control an operation state of the load device 130. For example, the EMS 140 may perform a peak-cut for reducing an electricity rate. In this case, the EMS 140 controls the storage battery apparatus 120 to perform charge at night time when an electricity demand is low and perform a discharge at time zone when the electricity demand becomes high. Thereby, the EMS 140 reduces peak power. On the other hand, in VPP control, the EMS 140 controls the storage battery apparatus 120 according to a control message from the control server 300.

The management server 200 is an apparatus performing maintenance and management of the storage battery apparatus 120. The management server 200 is a server of an O&M (Operation and Maintenance) service provider. The O&M service provider is an operator performing maintenance and management of the storage battery apparatus 120. The O&M service provider may be a maker of the storage battery apparatus 120. The management server 200 manages the storage battery apparatus 120 of a specific maker, or the storage battery apparatus 120 of a user having maintenance and management contract with the O&M service provider as a management object. The management server 200 performs communication with the storage battery apparatus 120 and performs remote monitoring. The management server 200 may perform communication with the storage battery apparatus 120 via the EMS 140.

The control server 300 is an apparatus controlling integratedly charge and discharge of the storage battery apparatus 120 of the facility 100. The control server 300 is a server of an aggregator. The aggregator is an operator who consolidates a distributed-type energy facility of the plurality of facilities 100 and performs power management. The aggregator provides adjusting force for obtaining demand-supply balance of power. The aggregator may be called as a resource aggregator. The control server 300 controls the facility of a user having contract with the resource aggregator, as a control object. The control server 300 controls the charge and discharge of the storage battery apparatus 120 to adjust power of requested amount, according to a request from the upper server 400. Concretely, the control server 300 transmits a control message indicating control of the storage battery apparatus 120 to the EMS 140.

The upper server 400 is an apparatus requesting adjustment of the flow amount or backward flow amount to the control server 300, to maintain demand-supply balance of power of the power grid 10. The upper server 400 is a server of a power company, or a server of an upper aggregator. The power company includes a power producer, power transmission and distribution business operator, retailer, or the like. The upper aggregator manages a plurality of resource aggregators. The upper server 400 may request, to the control server 300, reduction of the backward flow amount about a time zone which an amount of a photovoltaic power generation is large for example. Further, the upper server 400 may request, to the control server 300, reduction of the flow amount about a time zone which the amount of the photovoltaic power generation is small for example.

Figure 2:
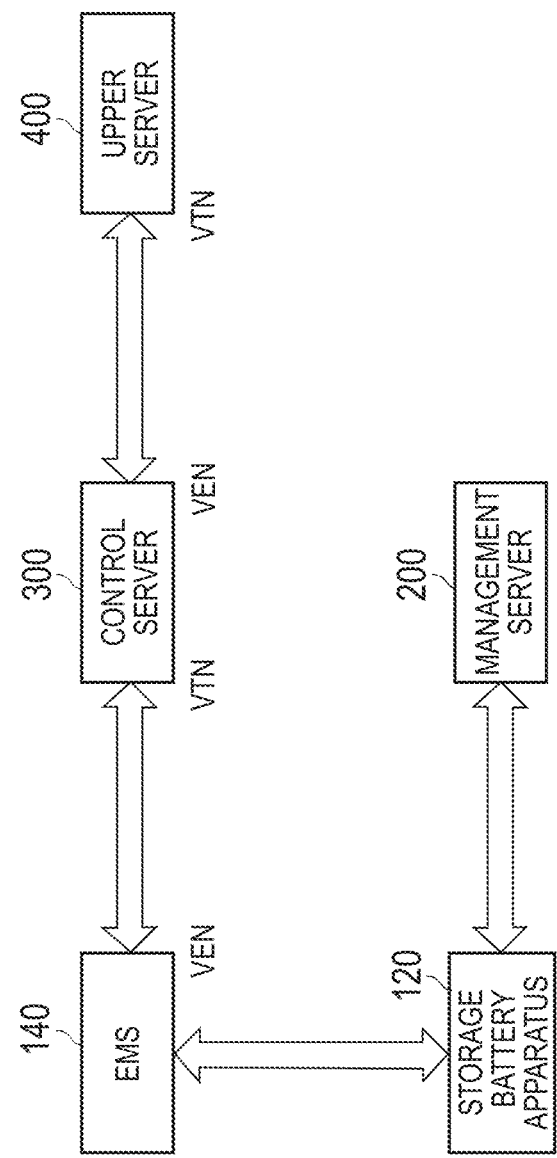
FIG. 2 is a diagram illustrating a communication path configuration in a management system according to an embodiment.

FIG. 2 is a diagram illustrating a communication path configuration in the management system 1 according to the present embodiment.

As illustrated in FIG. 2, the upper server 400 performs communication with the control server 300. Communication between the upper server 40 and control server 300 can use a protocol conforming to the OpenADR (Automated Demand Response) 2.0 or an original dedicated protocol. In the OpenADR2.0, a function transmitting a control message is called as a VTN (Virtual Top Node). Further, in the OpenADR2.0, a function receiving the control message is called as a VEN (Virtual End Node). The upper server 400 may transmit, to the control server 300, a flow control message (for example, DR (Demand Response) request, or DR event) requesting control of the flow. Or, the upper server 400 may transmit, to the control server 300, a backward flow control message requesting control of a backward flow. Control degree of the flow or the backward flow may be represented by an absolute value (for example, ○○kw), or a relative value (for example, ○○%).

The control server 300 performs communication with the upper server 400 and EMS 140. As communication between the control server 300 and EMS 140, a protocol conforming to the OpenADR2.0 or an original dedicated protocol can be used. The control server 300 may transmit, to the EMS 140, a flow control message requesting control of the flow (for example, DR request or DR event). Or, the control server 300 may transmit, to the EMS 140, a backward flow control message requesting control of the backward flow.

The EMS 140 performs communication with the control server 300 and storage battery apparatus 120. As communication between the EMS 140 and storage battery apparatus 120, a protocol conforming to the ECHONET Lite, SEP (Smart Energy Profile) 2.0, KNX, or original dedicated protocol can be used. The EMS 140 controls charge and discharge of the storage battery apparatus 120 according to a control message from the control server 300. Concretely, the EMS 140 transmits a message setting operation of the storage battery apparatus 120 to the storage battery apparatus 120. Thereby, the EMS 140 controls the storage battery apparatus 120.

The storage battery apparatus 120 performs communication with the EMS 140 and management server 200. As communication between the storage battery apparatus 120 and management server 200, an original dedicated protocol can be used. The storage battery apparatus 120 performs charge and discharge according to the message from the EMS 140.

The management server 200 performs communication with the storage battery apparatus 120, and performs remote monitoring of the storage battery apparatus 120. The management server 200 may perform the communication with the storage battery apparatus 120 via the EMS 140. Further, the management server 200 performs a process for avoiding that deterioration proceeds quickly in only some storage battery apparatuses out of the plurality of storage battery apparatuses 120 under control of the own. Concretely, the management server 200 specifies deterioration degree of each of the plurality of the storage battery apparatuses 120. The deterioration degree may a real deterioration degree. Or, the deterioration degree may be an estimated deterioration degree. The management server 200 selects an excluded storage battery apparatus based on the specified deterioration degree. The excluded storage battery apparatus is a storage battery apparatus excluding from an object of charge and discharge control by the control server 300 out of the plurality of the storage battery apparatuses 120. Further, the management server 200 notifies, to the control server 300, notification that the charge and discharge control to the selected excluded storage battery apparatus is unable.

However, in the present embodiment, the management server 200 does not have a direct communication path to the control server 300. Therefore, the management server 200 performs notification to the control server 300 via the storage battery apparatus 120 and EMS 140. Concretely, the management server 200 sets prohibition set information to the excluded storage battery apparatus. The prohibition set information indicates prohibition of the charge and discharge control by the control server 300. Thereby, the management server 200 performs notification that the charge and discharge control to the excluded storage battery apparatus is unable. The prohibition set information set by the storage battery apparatus 120 is read out by the EMS 140 and is transferred to the control server 300. Or, the management server 200 sets the prohibition set information to the EMS 140. The prohibition set information indicates prohibition of the charge and discharge control by the control server 300. Thereby, the management server 200 performs notification about that the charge and discharge control to the excluded storage battery apparatus is unable. The prohibition set information set to the EMS 140 is transferred from the EMS 140 to the control server 300. In the following, an example that the management server 200 sets the prohibition set information to the excluded storage battery apparatus will be described.

The control server 300 receives notification that the charge and discharge control to the excluded storage battery apparatus selected by the management server 200 is unable (prohibited). In this case, the control server 300 avoids the charge and discharge control to the excluded storage battery apparatus. Concretely, the control server 300 excludes the facility 100 including the excluded storage battery apparatus out of the facilities 100 belonging to the own, and performs VPP control.

(Storage Battery Apparatus)

Figure 3:
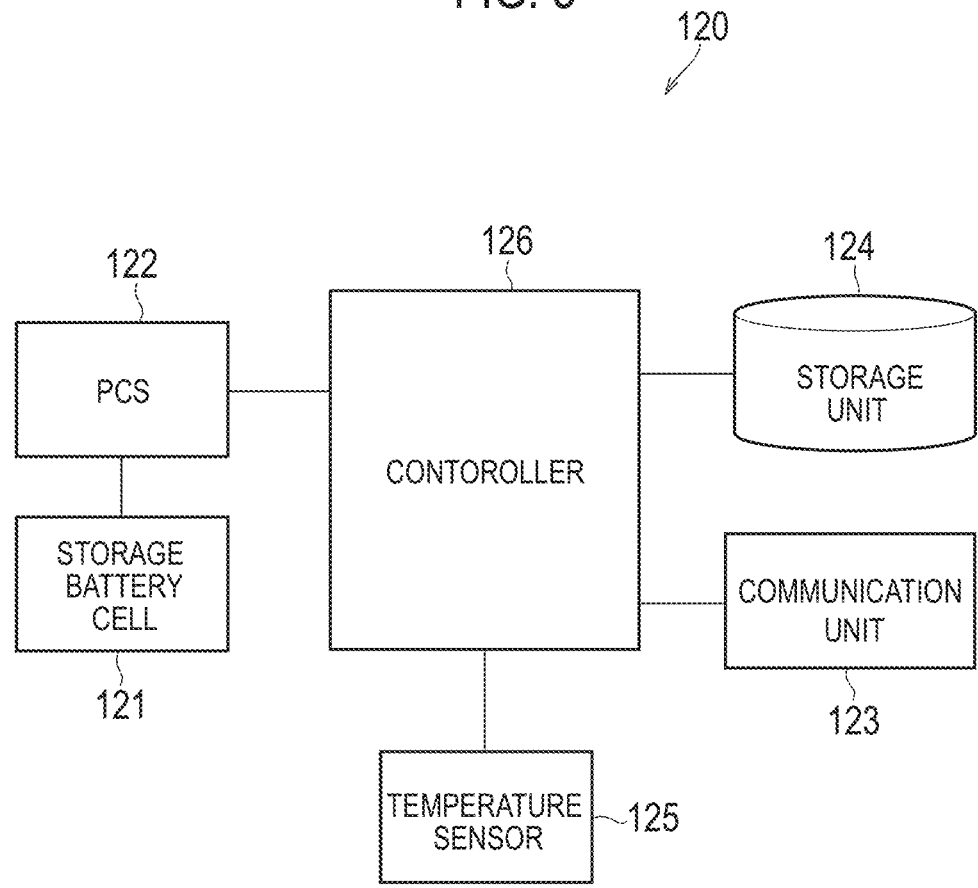
FIG. 3 is a diagram illustrating a configuration of a storage battery apparatus according an embodiment.

FIG. 3 is a diagram illustrating a configuration of the storage battery apparatus 120 according to the present embodiment.

As illustrated in FIG. 3, the storage battery apparatus 120 includes a storage battery cell 121, PCS (Power Conditioning System) 122, communication unit 123, storage unit 124, temperature sensor 125, and controller 126. The PCS 122 may include at least any one of the communication unit 123, storage unit 124, temperature sensor 125, and controller 126.

The storage battery cell 121 stores power input from the PCS 122. Further, the storage battery cell 121 outputs the power to the PCS 122.

The PCS 122 converts the power (direct current) input from the storage battery cell 121 to alternating current, at discharge, and outputs it. Further, the PCS 122 converts power (alternating current) input from the power grid 10 to direct current, at charge, and outputs it to the storage battery cell 121. The PCS 122 measures SOC (State of Charge and charge and discharge power. Further, the PCS 122 outputs measurement data to the controller 126.

The communication unit 123 performs communication with the EMS 140 and communication with the management server 200. The communication unit 123 includes a communication module. For example, the communication unit 123 transmits and receives a message conforming to the ECHONET Lite to and from the EMS 140. Further, the communication unit 123 transmits and receives a message conforming to an original dedicated protocol to and from the management server 200.

The storage unit 124 stores various types information. The storage unit 124 includes a memory. The storage unit 124 stores outside control set information, for example. The outside control set information is setting information indicating "permission" or "prohibition". That is, the outside control set information is setting information indicating permission or prohibition of the charge and discharge control from the control server 300. In the following, the outside control set information indicating "prohibition" may be called as outside control prohibition set information. The storage unit 124 may store setting information (initial information) that "permission" is default as the outside control set information.

The temperature sensor 125 measure temperature and outputs measurement data to the controller 126. The temperature sensor 125 may measure temperature of the storage battery cell 121. Or, the temperature sensor 125 may measure temperature of around of the storage battery cell 121.

The controller 126 controls each configuration included in the storage battery apparatus 120. The controller 126 includes a CPU (Central Processing Unit). The controller 126 decrypts a message that the communication unit 123 receives from the EMS 140. Further, the controller 126 controls the PCS 122 according to the message.

The communication unit 123 may receive a message requesting transmission of the outside control set information. In this case, the controller 126 reads out the outside control set information stored in the storage unit 124. Further, the controller 126 controls the communication unit 123 to transmit a response message including the read outside control set information to the EMS 140.

The communication unit 123 may receive the outside control set information ("prohibition") from the management server 200. In this case, the controller 126 updates the outside control set information stored in the storage unit 124 to "prohibition".

The controller 126 controls the communication unit 123 to transmit a message including a deterioration factor parameter to the management server 200. The deterioration factor parameter includes at least any one of SOC (State of Charge), temperature, and charge and discharge power.

The controller 126 controls the communication unit 123 to transmit, to the management server 200, a message including information indicating usage conditions of the storage battery apparatus 120. The usage conditions of the storage battery apparatus 120 is used for specification of deterioration degree (SOH; State of Health) of the storage battery apparatus 120. The information indicating the usage conditions of the storage battery apparatus 120 may include information indicating a present capacity of the storage battery apparatus 120. The present capacity of the storage battery apparatus 120 includes an AC effective capacity (charge), an AC effective capacity (discharge), for example. Or, the information indicating the usage conditions of the storage battery apparatus 120 may include information indicating a present resistance value of the storage battery apparatus 120. Or, the information indicating the usage conditions of the storage battery apparatus 120 may include information indicating an accumulated charging time and accumulated discharging time of the storage battery apparatus 120. Or, the information indicating the usage conditions of the storage battery apparatus 120 may include information indicating an accumulated charging amount and accumulated discharging amount of the storage battery apparatus 120. The information indicating the accumulated charging amount includes at least any one of an AC integrated charging power amount measurement value, AC instantaneous charging power amount measurement value, DC integrated charging power amount measurement value, DC instantaneous charging power amount measurement value, integrated charging power amount measurement value, instantaneous charging power amount measurement value, and instantaneous charging voltage measurement value. Further, the information indicating the accumulated discharging amount may include at least any one of an AC integrated discharging power amount measurement value, AC instantaneous discharging power amount measurement value, DC integrated discharging power amount measurement value, DC instantaneous discharging power amount measurement value, integrated discharging power amount measurement value, instantaneous discharging power amount measurement value, and instantaneous discharging voltage measurement value. The information indicating the usage conditions of the storage battery apparatus 120 may include information indicating the number of accumulated charging and discharging cycles.

(Management Server)

Figure 4:
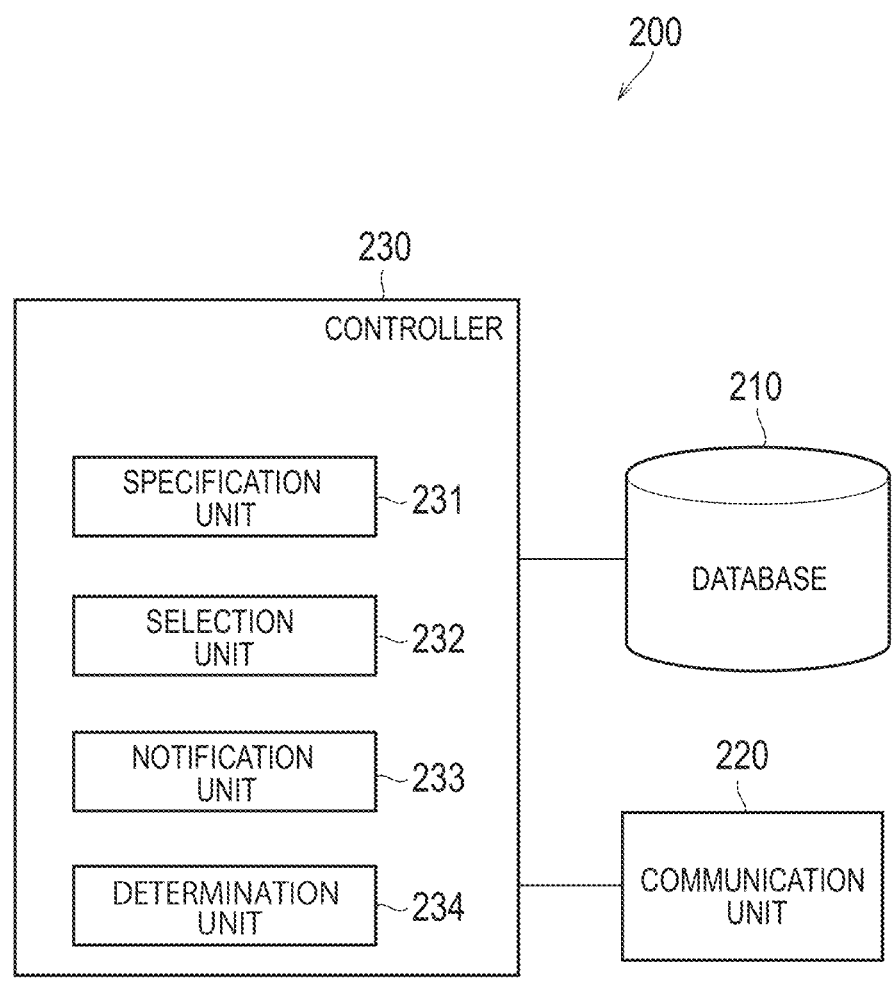
FIG. 4 is a diagram illustrating a configuration of a management server according to an embodiment.

FIG. 4 is a diagram illustrating a configuration of the management server 200 according to the present embodiment.

As illustrated in FIG. 4, the management server 200 includes a database 210, communication unit 220, and controller 230.

The database 210 is configured by a storage medium such as a memory and/or HDD or the like. The database 210 stores information and data used for control and processing in the controller 230. The database 210 stores data regarding to the storage battery apparatus 120 under control of the management server 200. The data regarding to the storage battery apparatus 120 may be a spec of the storage battery apparatus 120 installed in the facility 100. The spec may be an initial capacity (W) of the storage battery apparatus 120, initial resistance value (a), and rated output (W). The spec may be specified by a type of the storage battery apparatus 120.

The database 210 may store a target aged deterioration speed. The target aged deterioration speed indicates relation of target SOH to aging time of the storage battery apparatus 120. For example, the target aged deterioration speed is represented by the target SOH/the aging time. The aging time is time from installation of the storage battery apparatus 120. The aging time may be estimated from a total value of an accumulated discharge amount and accumulated charge amount from the installation of the storage battery apparatus 120. Or, the aging time may be estimated from a total value of an accumulated discharge time and accumulated charge time from the installation of the storage battery apparatus 120. Or, the aging time may be estimated from the number of accumulated charge and discharge cycles from the installation of the storage battery apparatus 120. The target SOH is a target value for a predetermined SOH to the aging time. The target aged deterioration speed may be different for each of the storage battery apparatuses 120.

The communication unit 220 is configured by a communication module. The communication unit 220 performs communication with the storage battery apparatus 120. The communication unit 220 receives a message including a deterioration factor parameter from the storage battery apparatus 120. The deterioration factor parameter includes at least any one of a SOC (Stated of Charge), temperature, and charge and discharge power. Further, the communication unit 220 receives a message including information indicating usage conditions of the storage battery apparatus 120 from the storage battery apparatus 120. Further, the communication unit 220 transmits a message including outside control set information to the storage battery apparatus 120.

The controller 230 is configured by a CPU or the like. The controller 230 controls each of configurations included in the management server 200. The controller 230 incudes a specification unit 231, selection unit 232, notification unit 233, and determination unit 234. The specification unit 231, selection unit 232, notification unit 233, and determination unit 234 may be configured by one CPU, or a plurality of CPUs.

The specification unit 231 specifies SOH of the storage battery apparatus 120 based on information stored in the database 210 and information received by the communication unit 220. The SOH of the storage battery apparatus 120 may be measured by the SOH=(present capacity/initial capacity)×100. Or, the SOH of the storage battery apparatus 120 may be measured by SOH=(present resistance value/initial resistance value)×100. Or, the SOH may be measured by that a maintenance mode is executed by a predetermined cycle (for example, 1 time/two years).

The SOH of the storage battery apparatus 120 may be estimated by {(capacity t1−deterioration capacity)/initial capacity}×100. The capacity t1 is capacity measured by the maintenance mode executed by the timing t1. The deterioration capacity is estimated by charge and discharge power (discharge amount and charge amount)×1 kWh deterioration ratio between the timing t1 and present timing. The 1 kWh deterioration ratio may be specified by a guarantee deterioration ratio of the storage battery apparatus 120. For example, in the storage battery apparatus 120, a deterioration ratio of 20% may be guaranteed at a charge and discharge cycle of 6000 times. In this case, the 1 kWh deterioration ratio may be represented by 1/3600. The SOH of the storage battery apparatus 120 may be specified from a SOH deterioration amount and charge and discharge power amount between the maintenance modes. The maintenance mode is executed by timing t0, t1.

The SOH of the storage battery apparatus 120 may be estimated based on the deterioration factor parameter. The deterioration factor parameter includes at least any one of the SOC (State of Charge), temperature, and charge and discharge power. Concretely, a future SOH may be estimated according to whether or not there is a condition that the storage battery apparatus 120 tends to deteriorate. For example, a case where temperature of the storage battery apparatus 120 is high is assumed. In this case, when charge and discharge of the storage battery apparatus 120 is performed, the SOH gets worse. For this reason, the specification unit 231 may estimate low SOH as the future SOH of the storage battery apparatus 120 which temperature is steadily high or the storage battery apparatus 120 which a ratio of time being high temperature is high. Further, a case where the SOC is zero or close to zero, that is, a storage battery residual amount is zero or close to zero is assumed. In this case, the SOH of the storage battery apparatus 120 gets worse. For this reason, the specification unit 231 may estimate low SOH as the future SOH of the storage battery apparatus 120 which a ratio of time when the SOC is zero or close to zero is high.

In the following, a measured SOH and estimated SOH may be called as SOH without any distinction.

The selection unit 232 selects an excluded storage battery apparatus excluding from an object of charge and discharge control based on the SOH specified by the specification unit 231, out of the storage battery apparatuses 120 under control of the management server 200. The selection unit 232 may select the storage battery apparatus 120 which the SOH is worst, as the excluded storage battery apparatus, out of the storage battery apparatuses 120 under control of the management server 200. The selection unit 232 may extract a predetermined number in order of worst SOH specified by the specification unit 231, and may select the extracted storage battery apparatus 120 as the excluded storage battery apparatus.

Or, the selection unit 232 may specify target SOH corresponding to aging time based on the target aged deterioration speed, regarding to each of the under managed storage battery apparatuses 120. In this case, the selection unit 232 may select the excluded storage battery apparatus based on a comparison result of the SOH specified by the specification unit 231 and the target SOH. Concretely, the selection unit 232 may select the excluded storage battery apparatus to restrain deterioration, regarding to the storage battery apparatus 120 which the specified SOH is worse than the target SOH.

However, if the number of the excluded storage battery apparatuses is increased too much, the storage battery apparatus 120 which the control server 300 is possible to control will be reduced and there is possibility that sufficient adjusting force cannot be ensured. For this reason, certain restriction may be placed on the exclusion. Concretely, the selection unit 232 maintain that a ratio occupied by the excluded storage battery apparatus out of the under managed storage battery apparatus 120 or the number of the excluded storage battery apparatus becomes equal to or less than a predetermined threshold value, and may select at least one excluded storage battery apparatus out of the under managed storage battery apparatus 120.

Here, the selection unit 232 may set the predetermined threshold value to ensure that the number of the storage battery apparatuses permitted charge and discharge control by the control server 300 out of the under managed storage battery apparatus 120 is equal to or more than a certain number. For example, a case where the number of under managed storage battery apparatus 120 is defined as "1000" and the number of or ratio of the storage battery apparatus permitted the charge and discharge control by the control server 300 is defined as "80" is assumed. In this case, the number or ratio possible to select as the excluded storage battery apparatus is "20". Or, the selection unit 232 may be set the predetermined threshold value. At this case, the predetermined threshold value may be set to ensure that a total rated output of the storage battery apparatus permitted the charge and discharge control by the control server 300 out of the under managed storage battery apparatus 120 is equal to or more than a certain value. Or, the predetermined threshold value may be set to ensure that total discharge reserve of the storage battery apparatus permitted the charge and discharge control by the control server 300 out of the under managed storage battery apparatus 120 is equal to or more than a certain value. Here, the discharge reserve represents power allocated for the charge and discharge control by the control server 300 out of the rated output of the storage battery apparatus 120. Or, the discharge reserve represents a power amount allocated for the charge and discharge control by the control server 300 out of storage battery residual quantity of the storage battery apparatus 120. The number of storage battery apparatuses permitted the charge and discharge control, total rated output of the storage battery apparatus permitted the charge and discharge control, and total discharge reserve of the storage battery apparatuses permitted the charge and discharge control are predetermined by agreement between an O&M service provide and aggregator.

It is assumed that the under managed storage battery apparatus 120 is grouped. In this case, the selection unit 232 may perform selection of the excluded storage battery apparatus individually for each group. For example, the under managed storage battery apparatus 120 may be grouped into a group A and group B. The group A includes the storage battery apparatus 120 of a control object of a control server A (aggregator A). The group B includes the storage battery apparatus 120 of a control object of a control server B (aggregator B). In this case, the selection unit 232 selects the excluded storage battery apparatus in the group A and group B separately. Or, a case where the under managed storage battery apparatus 120 is grouped for each of geographical areas (for example, power control) is assumed. In this case, the selection unit 232 selects the excluded storage battery apparatus in the geographical area separately.

The notification unit 233 notifies to the control server 300 notification that the charge and discharge control to the excluded storage battery apparatus selected by the selection unit 232 is unable. In the present embodiment, the notification unit 233 sets outside control prohibition set information to the excluded storage battery apparatus. The outside control prohibition set information indicates that the charge and discharge control by the control server 300 is prohibited. Thereby, the notification unit 233 performs notification that the charge and discharge control to the excluded storage battery apparatus is unable. Concretely, the notification unit 233 transmits a message including the outside control set information ("prohibition") to the excluded storage battery apparatus. The selection unit 232 may perform re-selection of the excluded storage battery apparatus at a predetermined cycle (for example, every one month, every one half of year, every one year). For example, in the case where certain restriction is placed on the exclusion, the selection unit 232 replaces the storage battery apparatus 120 selecting as the excluded battery apparatus regularly. In this case, the notification unit 233 may set outside control prohibition set information ("permission") to the storage battery apparatus 120 which selection as the excluded storage battery apparatus is released. The outside control prohibition set information ("permission") indicates that the charge and discharge control is permitted by the control server 300.

The determination unit 234 may permit the charge and discharge control by the control server 300 by limiting in a specific time zone, regarding to the storage battery apparatus 120 selected as the excluded storage battery apparatus. Concretely, the determination unit 234 determines the specific time zone permitting the charge and discharge control by the control server 300, regarding to the excluded storage battery apparatus selected by the selection unit 232. A case where the determination unit 234 performs the charge and discharge control to adjust power demand-supply balance of power grid by the control server 300 is assumed. In this case, the determination unit 234 determines the specific time zone based on information representing high of degree of necessity of the adjustment at each of time zones. The information representing the high of degree of necessity of the adjustment may be a reward (incentive) obtained by participating in VPP control. For example, the determination unit 234 determinates a time zone when the necessity adjusting the power demand-supply balance is high (that is, the time zone when the reward is high), as the specific time zone permitting the charge and discharge control by the control server 300. In this case, the notification unit 233 notifies, to the control server 300, notification that the charge and discharge control to the excluded storage battery apparatus is permitted at the specific time zone. For example, the notification unit 233 may set the outside control prohibition set information ("permission") at the specific time zone. The outside control prohibition set information ("permission") indicates that the charge and discharge control by the control server 300 is permitted.

The determination unit 234 may determine a time zone estimated that the storage battery apparatus is less likely to deteriorate, as the specific time zone permitting the charge and discharge control by the control server 300, based on temperature information (outside air temperature), regarding to the excluded storage battery apparatus. For example, the time zone estimated that the storage battery apparatus is less likely to deteriorate is a time zone that temperature corresponding to the excluded storage battery apparatus is equal to or less than a predetermined value.

An Example of Operation Sequence

FIG. 5 is a diagram illustrating an example of an operation sequence in the management system 1 according to the present embodiments.

As illustrated in FIG. 5, in Steps S101 to Step S103, each of the storage battery apparatuses 120 in the facilities 100A to 100C transmits a message to the management server 200. The message includes storage battery apparatus information regarding to own deterioration. The storage battery apparatus information may be a deterioration factor parameter of at least any one of SOC, temperature, and charge and discharge power. The storage battery apparatus information may be information indicating usage condition of the storage battery apparatus 120.

In Step S104, the management server 200 specifies degree of deterioration of each of the storage battery apparatuses 120 based on the storage battery apparatus information received from each of the storage battery apparatuses 120. Further, the management server 200 selects the excluded storage battery apparatus based on the specified degree of deterioration. It is assumed that the storage battery apparatus 120 of the facility 100A is selected as the excluded storage battery apparatus, and it will be described.

In Step S105, the management server 200 sets outside control set information ("prohibition") to the excluded storage battery apparatus, regarding to the storage battery apparatus 120 of the facility 100A. The outside control set information ("prohibition") indicates prohibition of the charge and discharge control by the control server 300. FIG. 6 is a diagram illustrating an example of the outside control set information set by the storage battery apparatus 120. FIG. 6 indicates an example of setting the outside control set information by a format conforming to the ECHONET Lite. As illustrated in FIG. 6, the outside control set information is added as new set information of the storage battery apparatus 120 (called to as "property"). For example, a property name is a "outside control set", and an index (EPC) of the "outside control set" is "0x**". The "outside control set" can obtain "0x41" (permission) and "0x42" (prohibition). Further, an "access rule" represents whether "Set" possible to set from the EMS 140 or "Get" possible to inquiry from the EMS 140 is applied. The "outside control set" is considered to as not apply the "Set" and to be applicable only the "Get". That is, the EMS 140 can inquiry the "outside control set" to the storage battery apparatus 120 and confirms, but the EMS 140 cannot set change its content.

In Step S106, the EMS 140 of the facility 100A transmits a Get message inquiring the "outside control set" to the storage battery apparatus 120 of the facility 100A. Concretely, the Get message includes "0x**" being the EPC of the "outside control set".

In Step S107, the storage battery apparatus 120 of the facility 100A transmits a Get response message including the "outside control set" to the EMS 140 of the facility 100A, in response to the Get message. The Get response message includes "0x**" being the EPC of the "outside control set" and "0x42" (prohibition) being setting content.

In Step S108, the EMS 140 of the facility 100A transmits a message to the control server 300, in response to that the "outside control set" is set to "0x42" (prohibition) in the Get response message. The message includes information indicating that the charge and discharge control by the control server 300 to the storage battery apparatus 120 of the facility 100A is prohibited. The message may include information that storage battery apparatus outside control is unable and an identifier of the facility 100A or identifier of the storage battery apparatus 120 of the facility 100A.

In Step S109, the control server 300 recognizes that the charge and discharge control to the storage battery apparatus 120 of the facility 100A is unable (prohibited), in response to the message from the EMS 140. In this time, the control server 300 excludes the facility 100A (storage battery apparatus 120) from a VPP control object.

In Step S110, the control server 300 selects the facility 100 being the VPP control object in response to a request from the upper server 400. Here, the control server 300 selects controlling the storage battery apparatus 120 after the excluded storage battery apparatus is excluded out of the facilities 100 (storage battery apparatus 120) belonging to the own. Here, it is assumed that the storage battery apparatus 120 of the facility 100B is selected and it will be described.

In step S111, the control server 300 transmits a flow control message or backward flow control message to the EMS 140 of the facility 100B. The flow control message is a message requesting control of the flow. The backward flow control message is a message requesting control of the backward flow.

Summary of Present Embodiment

According to the present embodiment, the management server 200 specifies each of the SOHs of the under managed storage battery apparatus 120. The management server 200 selects the excluded storage battery apparatus out of the under managed storage battery apparatus 120, based on the specified SOH. The excluded storage battery apparatus is a storage battery apparatus excluding from the object of the charge and discharge control by the control server 300. Further, the management server 200 notifies, to the control server 300, notification that the charge and discharge control to the selected excluded storage battery apparatus is unable. Thereby, even when the control server 300 performs an integrated control of the storage battery apparatus 120 without consideration of deterioration, it is possible to avoid that the deterioration proceeds quickly in only a part of the storage battery apparatuses.

Modified Examples

FIG. 7 is a diagram illustrating a modification example of a communication path configuration in the management system according to the present embodiment. In the following, it will be described about different point to the above embodiments.

As illustrated in FIG. 7, in the present modified example, a direct communication path between the control server 300 and the EMS 140 is not established. On the other hand, direct communication paths between the control server 300 and the management server 200, and between the management server 200 and the EMS 140 is established. Further, a direct communication path between the management server 200 and the storage battery apparatus 120 is not established.

Communication between the management server 200 and the control server 300 and communication between the management server 200 and the EMS 140 can use a protocol conforming to the OpenADR2.0 or an original dedicated protocol.

In this communication configuration, the management server 200 performs a protocol conversion between the control server 300 and the EMS 140. For example, the management server 200 receives a control message of the OpenADR2.0 from the control server 300. In this case, the management server 200 converts a format of the received control message to the original dedicated protocol and transmits it to the EMS 140.

Further, the management server 200 performs remote monitoring of the storage battery apparatus 120 via the EMS 140. The management server 200 performs a processing for avoiding that the deterioration proceeds quickly in only a part of the storage battery apparatus out of the plurality of the storage battery apparatuses 120 under management the own, similarly to the above embodiments. Concretely, the management server 200 selects the excluded storage battery apparatus excluding from an object of charge and discharge control by the control server 300 based on deterioration degree of each of the storage battery apparatuses 120 under management the own. Further, the management server 200 notifies, to the control server 300, notification that the charge and discharge control to the selected excluded storage battery apparatus is unable.

In the present modified example, the management server 200 has the direct communication path to the control server 300. Thereby, the management server 200 can notify directly to the control server 300. The notification may be a report message of the OpenADR2.0, for example. The message may include information that the storage battery apparatus outside control is unable and identifier of the excluded storage battery apparatus or identifier of the facility including the excluded storage apparatus.

FIG. 8 is a diagram illustrating an example of an operation sequence in the management system 1 according to the present modified example.

As illustrated in FIG. 8, in Steps S201 to S 204, each of the storage battery apparatuses 120 in the facilities 100A to 100C notifies a message to the management server 200 via the corresponding to the EMS 140. The message includes storage battery apparatus information regarding to own deterioration.

In Step S205, the management server 200 specifies deterioration degree of each of the storage battery apparatuses 120 based on the storage battery apparatus information of each of the storage battery apparatuses 120. Further, the management server 200 selects the excluded storage battery apparatus based on the specified deterioration degree. Here, it is assumed that the storage battery apparatus 120 of the facility 100A is selected as the excluded storage battery apparatus and it will be described.

In Step S206, the management server 200 transmits a message to the control server 300. The message includes information indicating prohibition of the charge and discharge control by the control server 300. The message may include information that storage battery outside control is unable and identifier of the storage battery apparatus 120 of the facility 100A or identifier of the facility 100A.

In Step S207, the control server 300 recognizes that charge and discharge control to the storage battery apparatus 120 of the facility 100A is unable (prohibited), in response to the message from the management server 200. Further, the control server 300 excludes the facility 100A (storage battery apparatus 120) from a VPP control object.

In Step S208, the control server 300 selects the facility 100 being the VPP control object in response to a request from the upper server 400. Here, the control server 300 selects controlling storage battery apparatus 120 after the excluded storage battery apparatus is excluded out of the facilities 100 (storage battery apparatuses 120) belonging to the own. Here, it is assumed that the storage battery apparatus 120 of the facility 100B is selected and it will be described.

In Step S209, the control server 300 transmits a flow control message or backward flow control message requesting backward flow control to the EMS 140 of the facility 100B. The flow control message is a message requesting flow control. The backward flow control message is a message requesting backward flow control.

Other Embodiments

Though it is not described specifically in the above embodiments, even when a case where the charge and discharge control to the excluded storage battery apparatus by the control server 300 is prohibited, charge and discharge control which the EMS 140 performs voluntarily to the excluded storage battery apparatus may be permitted. Or, when the charge and discharge control to the excluded storage battery apparatus by the control server 300 is prohibited, the charge and discharge control which the EMS 140 performs voluntarily may be prohibited.

In the above embodiments, the management server 200 includes the database 210, however, the embodiments should not be limited to this. The database 210 may be a cloud server installed on an internet.

Though it is not described specifically in the above embodiments, the EMS 140 may not necessarily install in the facility 100. For example, a part of functions of the EMS 140 may is provided by a cloud server installed on the internet. That is, it could be considered that the EMS 140 includes the cloud server.

Though it is described with reference to the drawings about the embodiments in details, concrete configuration is not limited to the above, and various design changes or the like are possible without deviating from the gist of the invention.

This application claims priority to Japanese application publication No. 2018-122949 (filed on Jun. 28, 2018), which is incorporated by reference herein in their entity.

The invention claimed is:

1. A management server comprising:
    at least one processor configured to
        communicate with a control server configured to perform charge and discharge control to an object including a plurality of storage battery apparatuses, and
        perform maintenance and management to the plurality of storage battery apparatuses, wherein
    the at least one processor is configured to execute:
        a specification process of specifying each of deterioration degree of the plurality of the storage battery apparatuses,
        a selection process of selecting an excluded storage battery apparatus excluded from the object of the charge and discharge control by the control server, out of the plurality of the storage battery apparatuses, based on the deterioration degree specified by the specification process, and
        a transmission process of transmitting, to the control server, information indicating that the charge and discharge control to the excluded storage battery apparatus selected by the selection process is unable.

2. The management server according to claim 1, wherein the at least one processor is configured to execute a process of setting prohibition set information indicating prohibition of the charge and discharge control by the control server to the excluded storage battery apparatus or a control apparatus of the excluded storage battery apparatus.

3. The management server according to claim 1, wherein the selection process includes a process of
    maintaining that a ratio occupied by the excluded storage battery apparatus out of the plurality of the storage battery apparatuses or the number of the excluded storage battery apparatuses becomes equal to or less than a predetermined threshold value, and selecting at least one excluded storage battery apparatus out of the plurality of the storage battery apparatuses, as the excluded storage battery apparatus.

4. The management server according to claim 3, wherein the selection process incudes a process of setting the predetermined threshold value to ensure that the number of remaining storage battery apparatuses, other than the excluded storage battery apparatus out of the plurality of the storage battery apparatuses, is equal to or more than a certain number, the remaining storage battery apparatuses other than the excluded storage battery apparatus being permitted for the charge and discharge control by the control server.

5. The management server according to claim 3, wherein the selection process includes a process of setting the predetermined threshold value to ensure that a total rated output of remaining storage battery apparatuses, other than the excluded storage battery apparatus out of the plurality of the storage battery apparatuses is equal to or more than a certain number, the remaining storage battery apparatuses other than the excluded storage battery apparatus being permitted for the charge and discharge control by the control server.

6. The management server according to claim 3, wherein the selection process includes a process of setting the predetermined threshold value to ensure that a total discharge reserve of remaining storage battery apparatuses, other than the excluded storage battery apparatus out of the plurality of the storage battery apparatuses is equal to or more than a certain number, the remaining storage battery apparatuses other than the excluded storage battery apparatus being permitted for the charge and discharge control by the control server, and the total discharge reserve represents power allocated for the charge and discharge control by the control server out of a rated output of the storage battery apparatus, or a power amount allocated for the charge and discharge control by the control server out of storage battery residual quantity of the storage battery apparatus.

7. The management server according to claim 1, wherein the selection process includes
a process of specifying target deterioration degree corresponding to aging time in each of the plurality of the storage battery apparatuses based on an aged deterioration speed representing relation of the target deterioration degree regarding to the aging time, and
a process of selecting the excluded storage battery apparatus out of the plurality of the storage battery apparatuses based on a comparison result between the specified deterioration degree and the target deterioration degree.

8. The management server according to claim 1, wherein the specification process incudes
a process of monitoring a deterioration factor parameter including at least any one of SOC (State of Charge), temperature, or charge and discharge power in each of the plurality of the storage battery apparatuses, and
a process of specifying estimated deterioration degree in each of the plurality of the storage battery apparatuses based on the deterioration factor parameter.

9. The management server according to claim 1, wherein the plurality of the storage battery apparatuses is divided into a plurality of groups, and the selection process incudes a process of performing selection of the excluded storage battery apparatus in each of the plurality of groups.

10. The management server according to claim 1, wherein the at least one processor is configured to execute:
a determination process of determining a specific time zone permitting the charge and discharge control by the control server in the excluded storage battery apparatus selected by the selection process, and
a process of transmitting, to the control server, information indicating that the charge and discharge control to the excluded storage battery apparatus is permitted at the specific time zone.

11. The management server according to claim 10, wherein
the control server is configured to perform the charge and discharge control for adjustment of a power demand-supply balance of a power grid, and
the determination process includes a process of determining the specific time zone based on information representing high of degree of necessity of the adjustment at each of time zones.

12. A management system comprising:
a control server;
a plurality of storage battery apparatuses; and
a management server, wherein
the control server is configured to perform charge and discharge control to an object including the plurality of storage battery apparatuses,
the management server includes:
at least one processor configured to perform maintenance and management to the plurality of storage battery apparatuses included in an object of the charge and discharge control by the control server, and
the at least one processor is configured to execute:
a specification process of specifying each of deterioration degree of the plurality of the storage battery apparatuses,
a selection process of selecting an excluded storage battery apparatus excluded from the object of the charge and discharge control by the control server, out of the plurality of the storage battery apparatuses, based on the deterioration degree specified by the specification process, and
a transmission process of transmitting, to the control server, information indicating that the charge and discharge control to the excluded storage battery apparatus selected by the selection process is unable.

13. A management method comprising:
communicating with a control server configured to perform charge and discharge control to an object including a plurality of storage battery apparatuses; and
performing maintenance and management to the plurality of storage battery apparatuses, wherein
the performing includes:
specifying each of deterioration degree of the plurality of the storage battery apparatuses,
selecting an excluded storage battery apparatus excluded from the object of the charge and discharge control by the control server, out of the plurality of the storage battery apparatuses, based on the specified deterioration degree, and
transmitting, to the control server, information indicating that the charge and discharge control to the selected excluded storage battery apparatus is unable.

* * * * *